(12) United States Patent
Herrema et al.

(10) Patent No.: US 9,461,377 B2
(45) Date of Patent: Oct. 4, 2016

(54) BATTERY TAP ELECTRICAL CONNECTOR

(71) Applicant: Flow-Rite Controls, Ltd., Byron Center, MI (US)

(72) Inventors: Mark W. Herrema, Rockford, MI (US); Ronald D. Earl, Wyoming, MI (US)

(73) Assignee: FLOW-RITE CONTROLS, LTD., Byron Center, MI (US)

( * ) Notice: Subject to any disclaimer, the term of this patent is extended or adjusted under 35 U.S.C. 154(b) by 21 days.

(21) Appl. No.: 14/524,556

(22) Filed: Oct. 27, 2014

(65) Prior Publication Data

US 2016/0118728 A1   Apr. 28, 2016

(51) Int. Cl.

| | |
|---|---|
| H01R 4/28 | (2006.01) |
| H01R 11/28 | (2006.01) |
| H01R 4/48 | (2006.01) |
| H01M 2/20 | (2006.01) |
| H01R 4/26 | (2006.01) |
| H01R 4/30 | (2006.01) |
| H01M 10/48 | (2006.01) |
| H01R 11/12 | (2006.01) |
| H01R 13/447 | (2006.01) |

(52) U.S. Cl.
CPC ........... *H01R 11/288* (2013.01); *H01R 4/4809* (2013.01); *H01R 11/285* (2013.01); *H01M 2/202* (2013.01); *H01M 10/484* (2013.01); *H01R 4/26* (2013.01); *H01R 4/30* (2013.01); *H01R 11/12* (2013.01); *H01R 13/447* (2013.01)

(58) Field of Classification Search
CPC  H01R 11/288; H01R 11/285; H01R 4/4809; H01R 4/26; H01R 4/30; H01R 11/12; H01R 11/28; H01R 13/447; H01M 10/484

USPC .................. 439/726, 754–759, 761, 500, 627
See application file for complete search history.

(56) References Cited

U.S. PATENT DOCUMENTS

| 4,808,495 A * | 2/1989 | Goldstein ............. H01M 2/043 429/175 |
|---|---|---|
| 2015/0064524 A1* | 3/2015 | Noh ....................... H01M 10/48 429/90 |

FOREIGN PATENT DOCUMENTS

| KR | 2013 0011659 A | 1/2013 |
|---|---|---|
| WO | 2014/019772 A1 | 2/2014 |

OTHER PUBLICATIONS

International Search Report and Written Opinion of the International Searching Authority for International Application No. PCT/US2015/046272 completed Oct. 29, 2015.
"Eagle Eye Level Light Installation and Operation Instructions", Flow-Rite Controls (Jun. 13, 2012).
"Philadelphia Scientific Battery Watering Monitor Installation and Operating Instructions", Philadelphia Scientific LLC (2010).
"Installing the i-Lite Sensor Part # BSVA-1000", Battery Watering Technologies (Undated by Acknowledged Prior Art).

\* cited by examiner

*Primary Examiner* — Javaid Nasri
(74) *Attorney, Agent, or Firm* — Warner Norcross and Judd LLP

(57) ABSTRACT

The specification discloses an electrical connector assembly including a conductive clip and cover. The conductive clip may be snap-fitted onto an intercell connector in a multi-cell. The cover is nonconductive and may be snap-fitted over the conductive clip to protect the clip and wires connected to the clip. The cover may include a wire management device to guide and protect wires such as those connected to the clip.

13 Claims, 5 Drawing Sheets

… (1/2)

BATTERY TAP ELECTRICAL CONNECTOR

BACKGROUND OF THE INVENTION

The present invention relates to electrical connectors and more specifically to electrical connectors for tapping multi-cell batteries.

Multi-cell batteries include a plurality of individual cells connected in series using lead intercell connector straps. When each cell provides 2 volts of power, a multi-cell battery can be created to provide any multiple of 2 volts of power.

It is common practice to tap a multi-cell battery to power a device such as a battery monitor. Normally, one or more of the lead intercell connector straps is tapped to connect electrical wires by means of a screw or threaded insert and bolt. However, the connecting of wires to batteries by these means is time consuming because several tools are required and several steps are required to be taken. First, an electric drill is used to drill a hole in the intercell connector. Second, a hammer is used to press fit the insert into the lead. Finally, the wire connection is secured to the insert using a bolt which is either turned by an electric drill or a hand screw driver.

Another common method of connecting wires to intercell connectors is to place a screw through a wire ring terminal and then drive the screw into the lead strap. This method has at least two drawbacks. Firstly, if the screw becomes stripped at either the screw/driver interface or the screw/lead interface, the procedure needs to be repeated or the connection may be too loose to properly transmit electricity. Secondly, if the screw is installed other than perpendicularly to the surface of the lead strap, the connection may be incapable of being properly tightened. The screw is often installed non-perpendicularly resulting in the need for a reinstallation or the tolerance of a suboptimal electrical connection.

Even when properly installed, the wires are vulnerable to being inadvertently snagged or pulled. These actions can cause electrical wires to become dislodged or broken leading to a failure in the electrical connection. To prevent this dislodgment or breakage, it is common to fix wires to the intercell connector with cable ties. To be affective the cable ties must be made of acid resistant material. Given that it is not common for cable ties to be made of acid resistant materials, this step is often skipped or used frugally. Additionally, the use of cable ties is viewed by some users as unsightly or not aesthetically pleasing.

SUMMARY OF THE INVENTION

The aforementioned problems are overcome by the present invention in which an electrical connection assembly enables relatively fast and easy connection of a device to a multi-cell battery.

In one embodiment, the connector assembly includes a conductive spring clip that may be snapped onto the intercell connector.

In another embodiment, the assembly includes a plastic or other non-conductive cover that may be snapped onto and over the strap. The cover may include one or more features such as a monitoring strip or a wire management device.

These and other advantages and features of the invention will be more fully understood and appreciated by reference to the description of the current embodiments and the drawings.

DESCRIPTION OF THE CURRENT EMBODIMENTS

Figure 1:
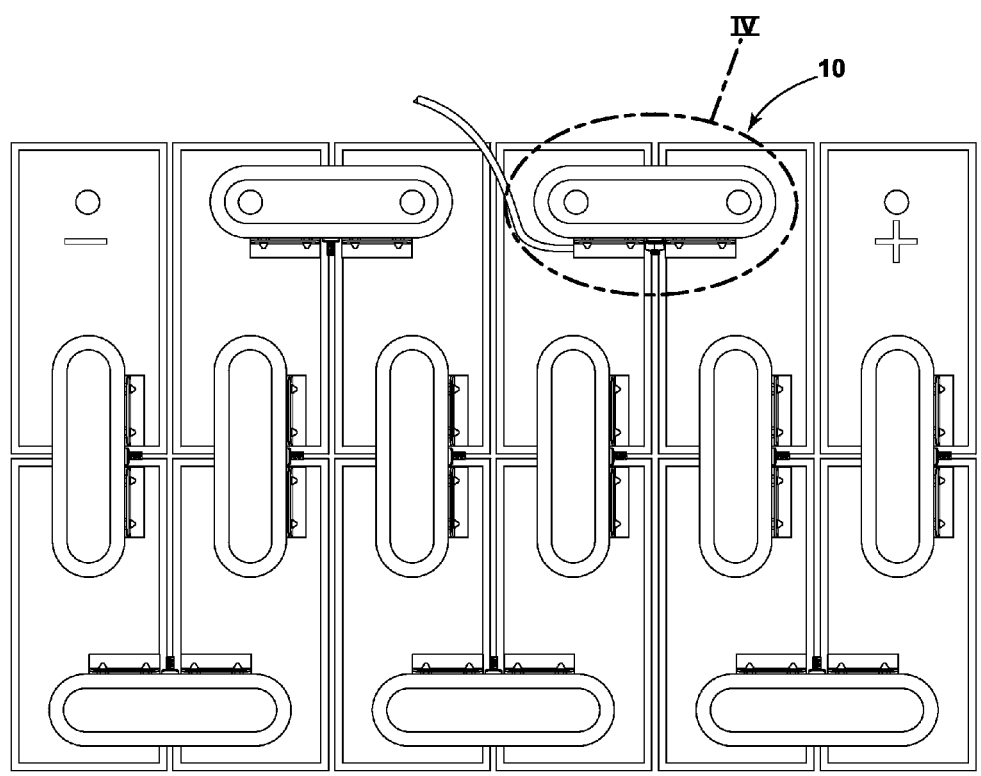
FIG. 1 is a top view of a multi-cell battery including the connection assembly of the present invention.

Before the embodiments of the invention are described in detail, it is to be understood that the invention is not limited to the details of operation or to the details of construction and the arrangement of the components set forth in the following description or illustrated in the drawings. The invention may be implemented in various other embodiments and can be practiced or carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

A quick electrical connector assembly 10 according to one embodiment of the present invention is shown in FIGS. 1-7. In the illustrated embodiment, the assembly 10 includes a conductive clip 100 and cover 20. The cover 20 may include a wire management device 30. The conductive clip 100 fits over or onto a strap or lead intercell connector strap 40. The intercell connector strap 40 includes at least two end portions 42, 44 that are associated with separate battery cells 50, 60 through contact with their associated and respective terminals 52, 62.

Figure 3:
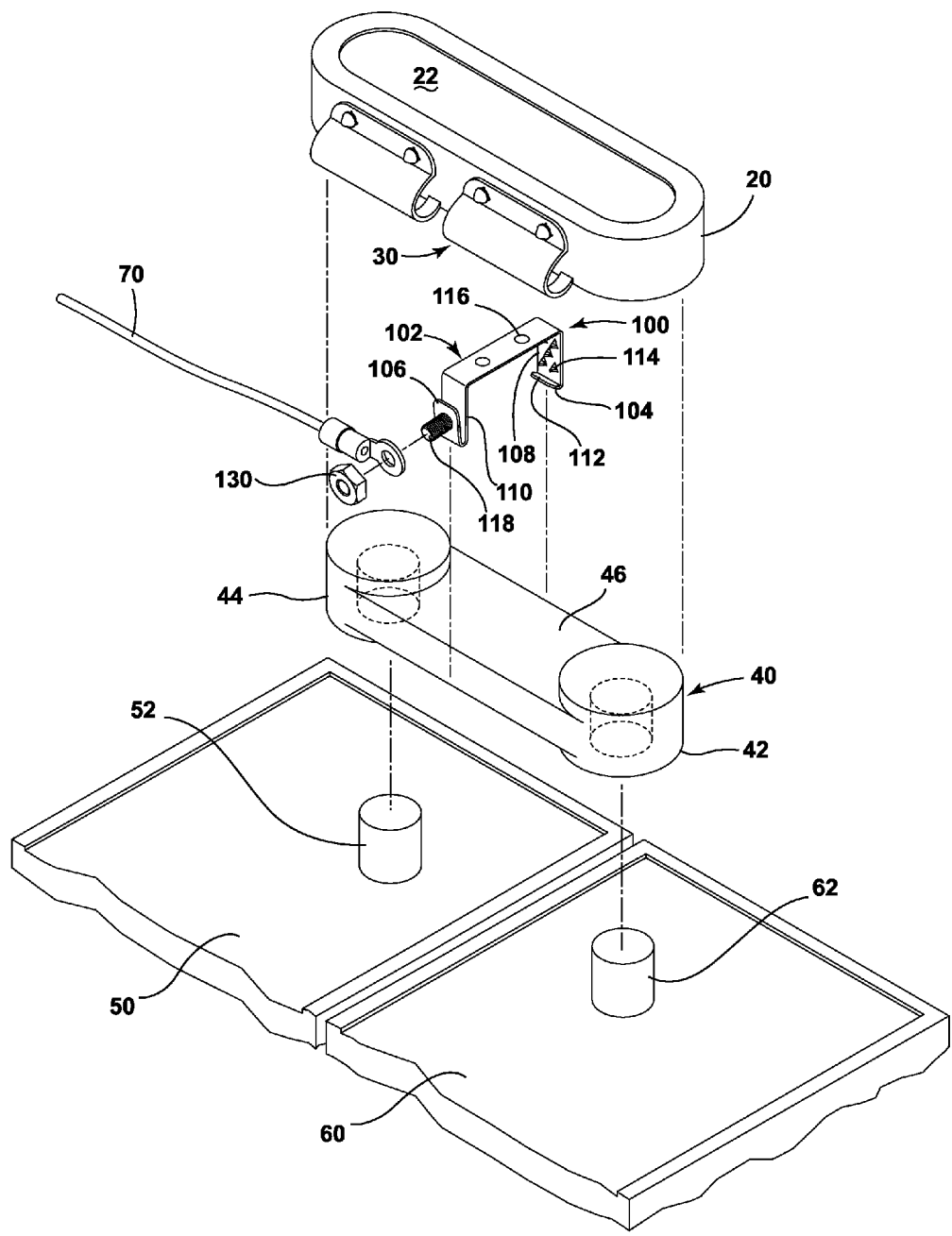
FIG. 3 is a perspective exploded view of the connection assembly of FIG. 2.
Figure 5:
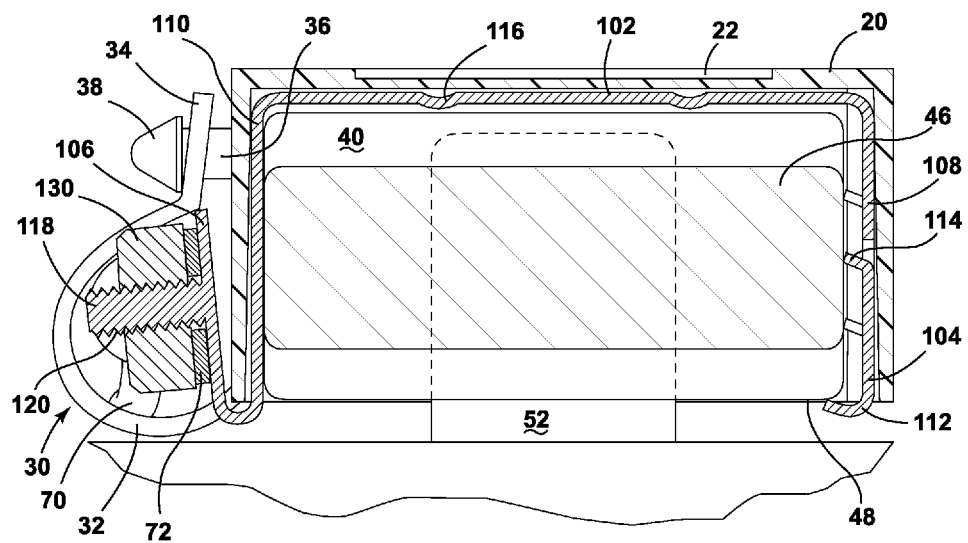
FIG. 5 is a cross-sectional view along line V-V of FIG. 4.

As shown in FIGS. 3 and 5, the conductive clip 100 may include an elongated body 102 with two ends 104, 106. The elongated body 102 may be bent or shaped to conform to the surface of the particular intercell connector strap 40 to which it may be fitted on or to and be formed to closely associate with the cover 20. As shown in FIGS. 3 and 5, the elongated body includes two arms 108, 110. One end 104 may include a bend or hook 112. The elongated body may also include one or more barbs 114 or dimples 116. One end 106 may include a projection 118 such as a stud or shaft. The projection 118 may provide a connection point between the conductive clip 100 and a device (not shown) that requires power from the battery cells 50, 60. The device may be a sensor or electrolyte level indicator for monitoring and displaying the status of cell electrolyte levels, or any other device requiring power from the battery cells 50, 60. The device wire 70 may include an electrical connector 72 that may be placed in close contact with the projections 118 of the clip 100. For example, as shown in the figures, the electrical connector 72 may be a ring connector and may be placed around the projection 118 and secured on the projection 118 by placing a nut 130 on a threaded surface 120 of the projection 118. While a projection 118, ring connector 72, and nut 130 are shown in the figures as providing electrical connection between the device wire 70 and the conductive clip 100, it should be understood that other suitable configurations of electrically conductive materials may be used as well.

The intercell connector strap 40 may include a center portion 46 between the two end portions 42, 44 that are associated with the battery cells 50, 60. The center portion 46 may be of a different thickness as compared to the end portions 42, 44 of the intercell connector strap 40. As shown in FIG. 5, the center portion 46 has a thinner cross-sectional area relative to the end portions 42, 44. Alternatively, the center portion 46 and end portions 42, 44 may be of the same thickness and have the same cross-sectional area.

Depending upon the placement of the clip 100 along the intercell connector strap 40, or the thickness of the center portion 46, the hook 112, barbs 114, and dimples 116 may serve to improve and/or enhance the electrical and/or physical connection between the conductive clip 100 and the intercell connector strap 40. For example, the intercell connector 40 may be made of lead and the clip 100 made of a material that is resistant to corrosion on contact with lead. In that case, the hook 112 and barbs 114 may dig into the surface of the intercell connector strap 40 to establish a more secure electrical and/or physical contact between the clip 100 and the intercell connector strap 40. As shown in FIGS. 3 and 5, the clip 100 may be secured to the intercell connector strap 40 along the center portion 46. In this position, the barbs 114 are in contact with the center portion 46 of the intercell connector strap 40. Alternatively, an intercell connector may be provided with a thicker center portion which may facilitate additional electrical contact points between the hook 112 and/or dimples 116 with the intercell connector. For example, the hook 112 of the clip 100 may fit around an edge 48 of the intercell connector strap 40 and the dimples 116 may contact the top side 49 of the intercell connector strap 40.

Figure 2:
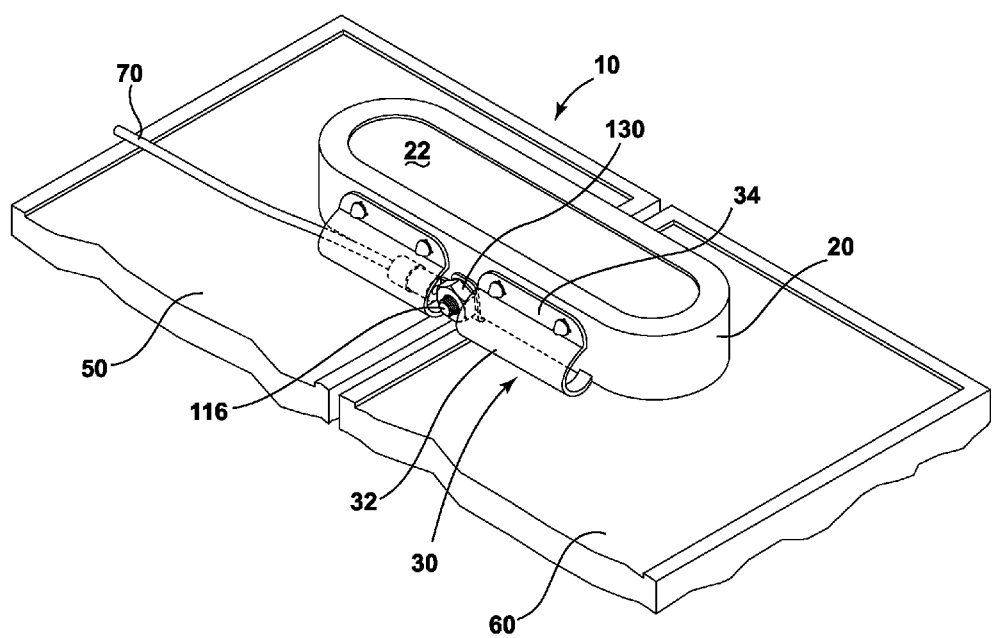
FIG. 2 is a perspective view of the connection assembly installed on the battery.
Figure 4:
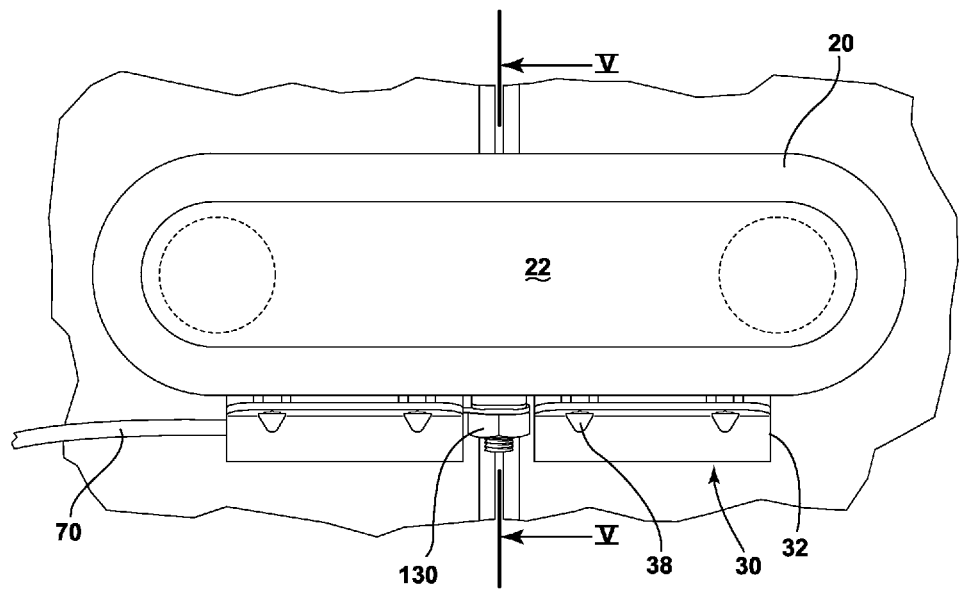
FIG. 4 is an enlarged top view of the connection assembly of FIG. 1.
Figure 6:
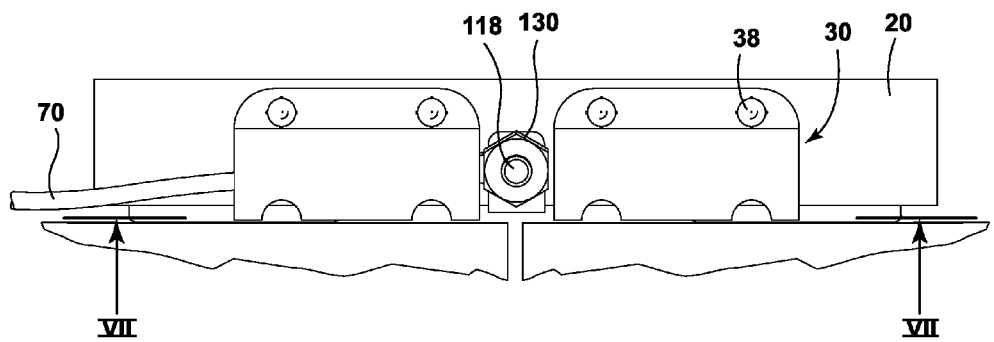
FIG. 6 is a side of the connection assembly.
Figure 7:
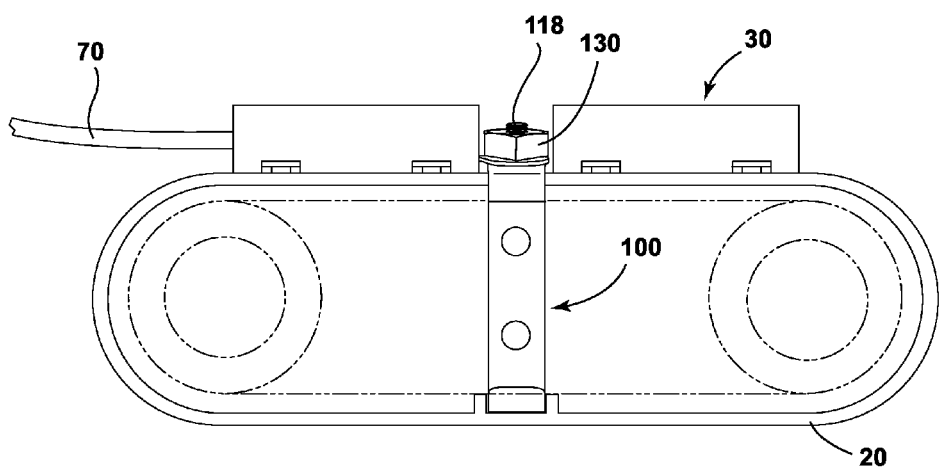
FIG. 7 is a bottom view of the connection assembly.

As best shown in FIGS. 2, 4, and 6, the assembly may include a wire management device 30 attached to the cover 20. The wire management device may serve to protect the device wire 70 and/or connection between the clip 100 and connector 72 by preventing objects from bumping or rubbing against the device wire 70 near the point it connects to the clip 100. The wire management device 30 may include an angular or curved wire holder 32 that can be attached to the cover in a number of ways. For example, as shown in FIG. 2, the wire holder 32 may be curved or tubular-shaped with a flanged portion 34 that can be attached to the cover by use of a pin 36 and button 38. Alternatively, the wire holder may be a curved or more angular hook. The pin 36 and button 38 may be fixed to the cover 20. The flanged portion 34 may be attached to the cover by aligning cutouts or holes (not shown) in the flanged portion 34 over the button 38 and snapping the flanged portion 34 onto the pin 36 over the button 38.

In use, the cover 20 with or without the wire management device 30 may be in place over the conductive clip 100. The device wire 70 may be threaded through or under the wire holder 32 and the connector 72 attached to the projection 118. Alternatively, the cover 20 may be placed over the conductive clip 100 and intercell connector strap 40 after the device wire 70 has been connected to the conductive clip 100. In that case, the device wire 70 may be placed in the wire holder 32 thereafter if the cover 20 includes a wire management device 30. The cover 20 may also include a monitoring strip 22 that can provide an indication of one or more battery conditions such as, for example, temperature or voltage.

Directional terms, such as "vertical," "horizontal," "top," "bottom," "upper," "lower," "inner," "inwardly," "outer" and "outwardly," are used to assist in describing the invention based on the orientation of the embodiments shown in the drawings. The use of directional terms should not be interpreted to limit the invention to any specific orientation(s).

The above description is that of current embodiments of the invention. Various alterations and changes can be made without departing from the spirit and broader aspects of the invention as defined in the appended claims, which are to be interpreted in accordance with the principles of patent law including the doctrine of equivalents.

This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to elements in the singular, for example, using the articles "a," "an," "the" or "the," is not to be construed as limiting the element to the singular.

The embodiments of the invention in which an exclusive property or privilege is claimed are defined as follows:

1. A battery assembly comprising:
    a multi-cell battery including a plurality of cells each including two terminals, the multi-cell battery further including a plurality of electrically conductive intercell connectors each connecting two terminals on different cells;
    at least one electrically conductive clip, each clip slidingly fitted directly onto one of the intercell connectors; and
    a plurality of electrically nonconductive covers, each cover fitted over one of the intercell connectors and over any conductive clip that may be fitted onto the one intercell connector, each cover including a wire management device.

2. The battery assembly of claim 1 wherein at least one of the covers includes a monitoring strip providing an indication of one or more battery conditions.

3. The battery assembly of claim 1 wherein each wire management device comprises a flange on the cover.

4. The battery assembly of claim 1 wherein each cover is further fitted over the two terminals connected to the intercell connector.

5. A battery assembly comprising:

a multi-cell battery including a plurality of cells each including two terminals, the multi-cell battery further including a plurality of electrically conductive intercell connectors each connecting two terminals on different cells; and a plurality of electrically nonconductive covers, each cover fitted over one of the intercell connectors, at least one of the covers including a monitoring strip providing an indication of one or more battery conditions.

6. The battery assembly of claim 5 wherein each cover includes a wire management device.

7. The battery assembly of claim 6 wherein each wire management device comprises a flange on the cover.

8. The battery assembly of claim 5:

further comprising an electrically conductive clip slidingly fitted directly onto one of the intercell connectors; and wherein each cover is further fitted over the two terminals connected to the intercell connector and any conductive clip fitted onto the intercell connector.

9. A battery assembly comprising:

a multi-cell battery including a plurality of cells each including two terminals, the multi-cell battery further including a plurality of electrically conductive intercell connectors each connecting two terminals on different cells; and a plurality of electrically nonconductive covers, each cover fitted over one of the intercell connectors, each cover including a wire management device.

10. The battery assembly of claim 9 wherein at least one of the covers includes a monitoring strip providing an indication of one or more battery conditions.

11. The battery assembly of claim 9 wherein each wire management device comprises a flange on the cover.

12. The battery assembly of claim 9 wherein each cover is further fitted over the two terminals connected to the intercell connector.

13. The battery assembly of claim 12:

further comprising an electrically conductive clip slidingly fitted directly onto one of the intercell connectors; and wherein each cover is further fitted over any conductive clip fitted onto the intercell connector.

* * * * *